United States Patent
Xiao et al.

(10) Patent No.: US 7,936,027 B2
(45) Date of Patent: May 3, 2011

(54) METHOD OF MRAM FABRICATION WITH ZERO ELECTRICAL SHORTING

(75) Inventors: Rongfu Xiao, Fremont, CA (US); Chyu-Jiuh Torng, Pleasanton, CA (US); Tom Zhong, Saratoga, CA (US); Witold Kula, Cupertino, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 666 days.

(21) Appl. No.: 12/006,889

(22) Filed: Jan. 7, 2008

(65) Prior Publication Data

US 2009/0173977 A1    Jul. 9, 2009

(51) Int. Cl.
G11C 11/02    (2006.01)

(52) U.S. Cl. ......... 257/421; 257/E21.665; 257/E27.006; 365/158; 438/3

(58) Field of Classification Search .......... 257/421, 257/422, 427, E21.665, E27.006; 365/158; 438/3
See application file for complete search history.

(56) References Cited

U.S. PATENT DOCUMENTS

| | | | |
|---|---|---|---|
| 6,897,532 B1 * | 5/2005 | Schwarz et al. | 257/367 |
| 6,933,155 B2 | 8/2005 | Albert et al. | |
| 6,972,265 B1 * | 12/2005 | Schwarz | 438/720 |
| 6,984,529 B2 | 1/2006 | Stojakovic et al. | |
| 7,211,446 B2 | 5/2007 | Gaidis et al. | |
| 7,252,774 B2 | 8/2007 | O'Sullivan et al. | |
| 7,374,952 B2 * | 5/2008 | Kasko et al. | 438/3 |
| 7,531,367 B2 * | 5/2009 | Assefa et al. | 438/3 |
| 2004/0127054 A1 * | 7/2004 | Lee et al. | 438/712 |
| 2004/0205958 A1 | 10/2004 | Grynkewich et al. | |
| 2006/0171197 A1 * | 8/2006 | Klostermann et al. | 365/158 |
| 2006/0234445 A1 | 10/2006 | Yang | |
| 2007/0187785 A1 * | 8/2007 | Hung et al. | 257/421 |
| 2009/0256220 A1 * | 10/2009 | Horng et al. | 257/421 |
| 2010/0097846 A1 * | 4/2010 | Sugiura et al. | 365/158 |

OTHER PUBLICATIONS

Co-pending U.S. Appl. No. 11/973,751, filed Oct. 10, 2007, "MRAM with Means of Controlling Magnetic Anisotropy", assigned to the same assignee as the present invention.
"MRAM with novel shaped cell using synthetic anti-ferromagnetic free layer," by Y.K. Ha et al., 2004 Symposium on VLSI Technology Digest of Technical Papers, pp. 24-25.
"Disturb Robust Switching Astroid Curve of C-Shape Cell With Weakly Coupled Synthetic Antiferromagnetic Layer," by Nakayama et al., IEEE Transactions on Magnetics, vol. 42, No. 10, Oct. 2006, pp. 2733-2835.

* cited by examiner

*Primary Examiner* — Anh Phung
*Assistant Examiner* — Michael Lulis
(74) *Attorney, Agent, or Firm* — Saile Ackerman LLC; Stephen B. Ackerman

(57) ABSTRACT

An MTJ cell without footings and free from electrical short-circuits across a tunneling barrier layer is formed by using a Ta hard mask layer and a combination of etches. A first etch patterns the Ta hard mask, while a second etch uses $O_2$ applied in a single high power process at two successive different power levels. A first power level of between approximately 200 W and 500 W removes BARC, photoresist and Ta residue from the first etch, the second power level, between approximately 400 W and 600 W continues an etch of the stack layers and forms a protective oxide around the etched sides of the stack. Finally, an etch using a carbon, hydrogen and oxygen gas completes the etch while the oxide layer protects the cell from short-circuits across the lateral edges of the barrier layer.

19 Claims, 4 Drawing Sheets

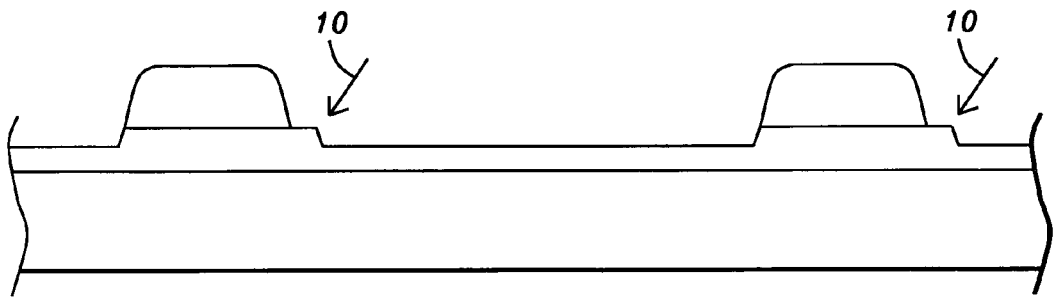
FIG. 1 - Prior Art
| R/C | 8 | 7 | 6 | 5 | 4 | 3 | 2 |
|---|---|---|---|---|---|---|---|
| 8 | 315 | 245 | 399 | 385 | 340 | 764 | |
| 7 | 474 | 392 | 518 | 720 | 406 | 757 | 717 |
| 6 | 312 | 345 | 494 | 410 | 355 | 458 | 547 |
| 5 | 321 | 431 | 374 | 510 | 614 | 667 | 404 |
| 4 | 273 | 441 | 444 | 445 | 500 | 418 | 241 |
| 3 | 301 | 750 | 435 | 471 | 399 | 311 | 297 |
| 2 | 537 | 298 | 733 | 360 | 474 | 794 | 1922 |
FIG. 2 - Prior Art

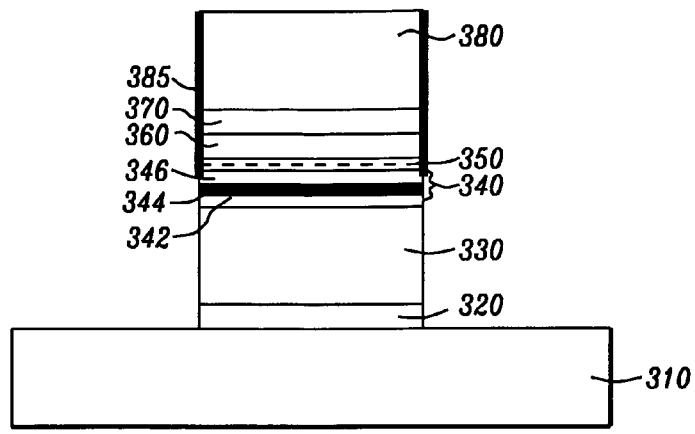
FIG. 3e
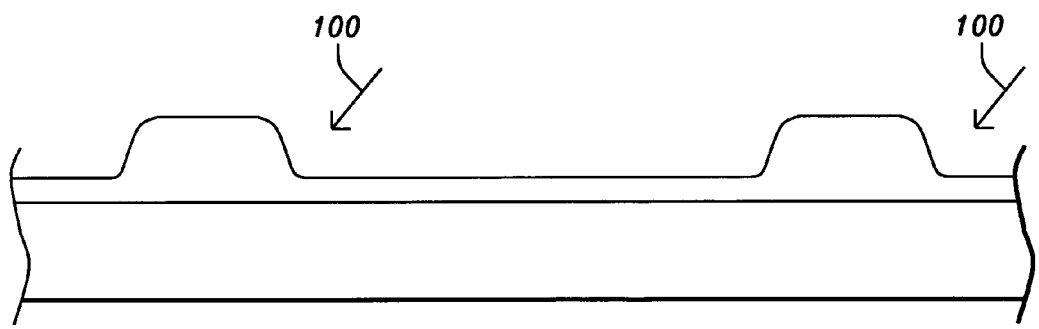
FIG. 4
| R/C | 8 | 7 | 6 | 5 | 4 | 3 | 2 |
|---|---|---|---|---|---|---|---|
| 8 | 5 | 2 | 1 | 2 | 2 | 2 | |
| 7 | 0 | 6 | 2 | 1 | 1 | 3 | 3 |
| 6 | 0 | 1 | 1 | 3 | 5 | 0 | 5 |
| 5 | 4 | 1 | 5 | 2 | 1 | 2 | 2 |
| 4 | 25 | 3 | 4 | 5 | 0 | 4 | 1 |
| 3 | 2 | 5 | 2 | 4 | 7 | 2 | 6 |
| 2 | 25 | 3 | 3 | 1 | 1 | 2 | 8 |
FIG. 5

METHOD OF MRAM FABRICATION WITH ZERO ELECTRICAL SHORTING

BACKGROUND OF THE INVENTION

1. Field of the Invention

This invention relates to the fabrication of a magnetic random access memory (MRAM) device using a magnetic tunneling junction (MTJ) cell and more particularly to a method of its fabrication that results in the elimination of electrical shorting.

2. Description of the Related Art

The magnetic tunneling junction (MTJ) device, is a form of tunneling magnetoresistive (TMR) device in which the relative orientation of uni-directional magnetic moments in parallel, vertically separated upper and lower magnetized layers, controls the flow of spin-polarized electrons tunneling through a very thin dielectric layer (the tunneling barrier layer) formed between those layers. When injected electrons pass through the upper layer they are spin polarized by interaction with the magnetic moment of that layer. The probability of such an electron then tunneling through the intervening tunneling barrier layer into the lower layer then depends on the availability of states within the lower electrode that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer.

The MTJ cell can be used as a magnetic read head, in which configuration the magnetic moment of the lower magnetized layer is fixed (pinned) in direction, while the magnetic moment of the upper magnetized layer is free to vary continuously under the action of the magnetic field of a moving magnetic medium (i.e. a disk). In that application, therefore, the MTJ device can be viewed as a kind of variable resistor, since different relative orientations of the magnetic moments will change the magnitude of a current passing through the device.

When the MTJ cell is used as an information storage element in a magnetoresistive random access memory (MRAM) cell array, the magnetic moment of the upper layer is only allowed to have two orientations, parallel or antiparallel to the fixed magnetic moment of the lower magnetized layer. When used in this way, the cell behaves as a resistor with only two resistance values, high (antiparallel magnetic moment directions) and low (parallel magnetic moment directions), which can then be treated as logical 1 and 0.

One of the critical challenges in MRAM technology is the patterning of the MTJ stack materials to form an MRAM cell. The term "stack," as used here, refers to the unpatterned, deposited layered structure of conducting, magnetic and dielectric materials. The phrase, "patterning of the stack," or the like, as used here, refers to the reduction of the lateral dimensions of the stack to the desired dimensions of the cell and to providing the cell with a desired horizontal cross-sectional shape, typically accomplished by etching away portions of the stack peripherally disposed about an etch mask formed on the upper surface of the stack. Because the prior art MTJ stack includes a very thin tunneling barrier layer, typically a layer of AlOx or MgO approximately 10 to 20 angstroms in thickness, shorting or shunting of the current around the junction is a critical problem. Clearly, imprecise patterning could create shorting pathways along the lateral edges of the cell. In addition, precise control of the size and shape of the MTJ cell during its patterning is increasingly important because these factors affect the magnetic and switching properties of the cell.

In MRAM devices, the elimination of electrical shorting is vital to successful mass-production manufacturing. Among all MRAM fabrication processes, MTJ etching is perhaps the most troublesome step in terms of providing a limitation on shorting. The root cause of electrical shorting that results from this step is mainly from shorting of the MTJ dielectric tunneling barrier layer at its outside edge (the etched edge), which is partially due to either an unetched "footing" or a re-deposition of the electrically conducting byproducts resulting from the etching process. Although the footing could exist for any horizontal cross-sectional shaped device, the worst case is typically associated with the so-called C-state, which is a concave shape shown in FIGS. 1a and 1b below. This problem has been discussed in the prior art, particularly by Y. K. Ha et al., in Symp. VLSI Techn. Dig., 2004, p. 22; in M. Nakayama et al., IEEE Tran. Mag., Vol. 42, p. 2733. In addition to these discussions, the following prior art also discloses attempts to deal with the discussed problem.

U.S. Pat. No. 7,211,446 (Gaidis et al) eliminates electrical shorting due to residual material by selectively exposing portions of the free layer, then converting those portions to electrically and magnetically inactive material.

U.S. Pat. No. 6,984,529 (Stojakovic et al) teaches etching an MTJ stack using 5 etch recipes where a surface oxidation is formed after the third etch recipe and the fifth etch recipe removes redeposited materials.

U.S. Pat. No. 7,252,774 (O'Sullivan et al) discloses a selective chemical etch method for an MTJ stack.

U.S. Pat. No. 6,933,155 (Albert et al) lowers electrical shorting by forming polishing resistant structures of SiN in regions around the MTJ stack.

U.S. Patent Application 2006/0234445 (Yang-Headway) teaches forming SiN spacers on sidewalls of the MTJ stack before CMP to prevent shorting.

U.S. Patent Application 2004/0205958 (Grynkewich et al) uses sidewall spacers and a masking tab to prevent deposition of metallic particles during etching to reduce electrical shorting.

Referring to FIG. 1, there is shown a schematic sketch of a side TEM view of two MTJ cell C-state (5) in vertical cross-section having a dimension of several hundreds of nanometers. The cells have been etched by a commonly used prior-art RIE process. An arrow (10) points to the region where the etching process has left a footing.

Referring to FIG. 2, there is shown a table indicating the failure rates in PPM of MTJ cells due to electrical shorting resulting from prior-art etching methods across 49 sectors of a typical 8" diameter production wafer. This table is shown for comparison purposes with a later table showing the results of etching processes carried out according to the method of the present invention. Although it might reasonably be assumed that a longer etching process using $CF_4$ gas would produce a more well defined etch and eliminate both the footing and the residue, this turns out not to be the case. In fact, none of the prior arts disclosed above deal effectively with the problem. Therefore, a new method of patterning an MTJ stack is needed, if a TMJ cell of arbitrary horizontal cross-sectional shape and neither short-circuits nor footings is to be fabricated.

FIG. 3a is a schematic vertical cross-sectional view of an MTJ stack of a material structure and configuration to be patterned by the method of the present invention. The lower layer (310) is a bottom electrode for the purpose of injecting a current. On this electrode will be formed a magnetically pinned structure that comprises a seed layer (320) of NiCr, an antiferromagnetic layer (320) typically of MnPt which will serve as a pinning layer, an Ru coupled pinned layer (340) that is itself a tri-layered structure of the form CoFe/Ru/CoFe in which the first CoFe layer is pinned by the antiferromagnetic layer (320) and is then coupled to the second CoFe layer across the Ru layer. On this pinned structure is then formed the dielectric tunneling barrier layer (350) as a layer of either AlOx or MgO. On this barrier layer is then formed the magnetically free layer (360) as a layer of CoFe or NiFe. On this free layer is then formed a non-magnetic capping layer (370) as a layer of NiFeHf. On this capping layer is then formed a hard mask layer (380) as a layer of Ta.

The tunneling barrier layer or junction layer (350) is formed on the pinned layer, typically by first forming a layer of a metal such as aluminum (or magnesium) and then subjecting the aluminum (or magnesium) to oxidation.

SUMMARY OF THE INVENTION

A first object of this invention is to provide a method for RIE patterning of an MTJ stack (such as described above) that substantially reduces or eliminates electrical shorting in the resulting cell.

A second object of this invention is to provide a method for RIE patterning of an MTJ stack that does not result in the creation of unetched footings around the base of the patterned stack.

A third object of the present invention is to provide a method for RIE patterning of an MTJ stack that does not result in the re-deposition of etching residue about the base of the stack.

A fourth object of the present invention is to provide a method of eliminating large standard deviations in the of distributions of sensor resistances.

A fifth object of the present invention is to meet the previous objects whether the horizontal cross-sectional shape of the patterned cell is convex or concave.

These objects will be met by a new method for forming MTJ devices by patterning MTJ stacks. The method includes the following briefly described steps:

1. form the following multilayer MTJ stack:
   BE/NiCr/MnPt/CoFe/Ru/CoFe/AlOx/NiFe/NiFeHf/Ta
2. anneal the stack;
3. prepare stack for photolithographic patterning using a layer of photoresist over a layer of bottom Anti-Reflection Coating (BARC) over the Ta hard mask layer;
2. in an RIE chamber apply a $CF_4$ gas hard mask etch to etch unprotected lateral portions of the Ta hard mask layer, over-etching through the upper layer Ta hard mask into the NiFeHf capping layer;
3. apply the first step of a continuous high power oxygen process at a 200 W-500 W power level to clean off remaining photoresist and BARC and to clean away any Ta redeposited material;
4. continue the high powered oxygen process, for between 110 s and 150 s, at a higher power level of between 400 W and 600 W to further etch away the exposed NiFeHf capping layer, the NiFe free layer, the AlOx barrier layer, then stopping approximately midway through the contiguous CoFe pinned layer to make certain that the AlOx barrier layer has been completely etched through, leaving an oxide layer surrounding all exposed surfaces;
5. in another chamber, etch the remaining unetched layers using a $CH_3$ OH etchant under high bias power, during which process the remaining Ta hard mask protects the unetched portion of the stack due to etch selectivity between the Ta and the remaining MTJ materials (NiFe, CoFe, MnPt) under the $CH_3$ OH etchant.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein:

FIG. 1 shows a schematic side view of two C-state cells as they would be etched by a prior-art RIE process.

FIG. 2 is a tabular representation of failure rates across an 8" production wafer resulting from using a prior art RIE process.

FIG. 3e shows the results of a final $CH_3OH$ etch to complete the cell patterning without the formation of short-circuit paths across the sides of the cell.

FIG. 4 schematically shows a side TEM view of two cells patterned in accord with the process of the present invention.

FIG. 5 is a tabular representation of cell failure rates across 49 sectors of an 8" production wafer using the present process.

DESCRIPTION OF THE PREFERRED EMBODIMENTS

The preferred embodiment of the present invention is the formation of a patterned MTJ stack using a reactive ion etch (RIE) and the production, thereby, of an MTJ cell that is free of electrical shorting and suitable for use in an MRAM array.

Figure 3A:
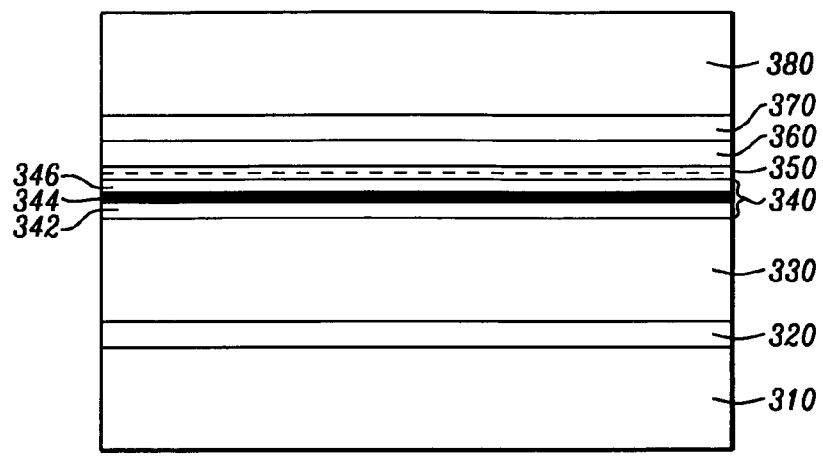
FIG. 3a shows an MTJ multilayer structure suitable for the application of the present process.

Referring to FIG. 3a, there is shown a schematic vertical cross-sectional view of a horizontally multi-layered MTJ stack of a material structure, dimensions and configuration to be effectively patterned by the method of the present invention. The lower layer (310) is a bottom electrode for the purpose of injecting a current. On this electrode will be formed a horizontally multi-layered magnetically pinned structure that comprises a seed layer (320) of NiCr formed to a thickness between approximately 30 and 60 Angstroms, an antiferromagnetic layer (330), typically of MnPt formed to a thickness between approximately 120 and 300 Angstroms, but which can be IrMn, MnNi or any intrinsic antiferromagnetic material that can exchange couple with a ferromagnetic material so as to fix the magnetic directions of the entire structure, an Ru coupled layer (340) that is itself a tri-layered structure of the form CoFe/Ru/CoFe in which the first CoFe layer (342), formed to a thickness between approximately 10-30 Angstroms, has its magnetization fixed in space by exchange coupling with the contiguous antiferromagnetic layer (320) and is then, in turn, coupled to the second CoFe (346) layer, also formed to a thickness between approximately 10-30 Angstroms, across the Ru (344) layer, whose thickness is between approximately 7-15 Angstroms. Thus, the multi-layered pinned structure comprises the constituent layers (320), (330), (342), (344) and (346).

On this multi-layered pinned structure there is then formed the dielectric tunneling barrier layer (350) as a layer of either AlOx or MgO formed to a thickness between approximately 7-20 Angstroms, but which can be dielectric layer formed as a metallic oxide of a different metal. On this barrier layer is then formed the magnetically free layer (360) as a layer of CoFe or NiFe having a thickness between approximately 15-50 Angstroms. On this free layer is then formed a non-magnetic capping layer (370), preferably as a layer of NiFeHf formed to a thickness between approximately 25-80 Angstroms, but which can be a layer of the form NiFeX with X being Hf, Zr, Nb, Ru, Mg Zr or other non-magnetic metal having a sufficiently high concentration to render the NiFeX non-magnetic. On this capping layer is then formed a hard mask layer (380) as a layer of Ta formed to a thickness between approximately 400-600 angstroms.

Figure 3B:
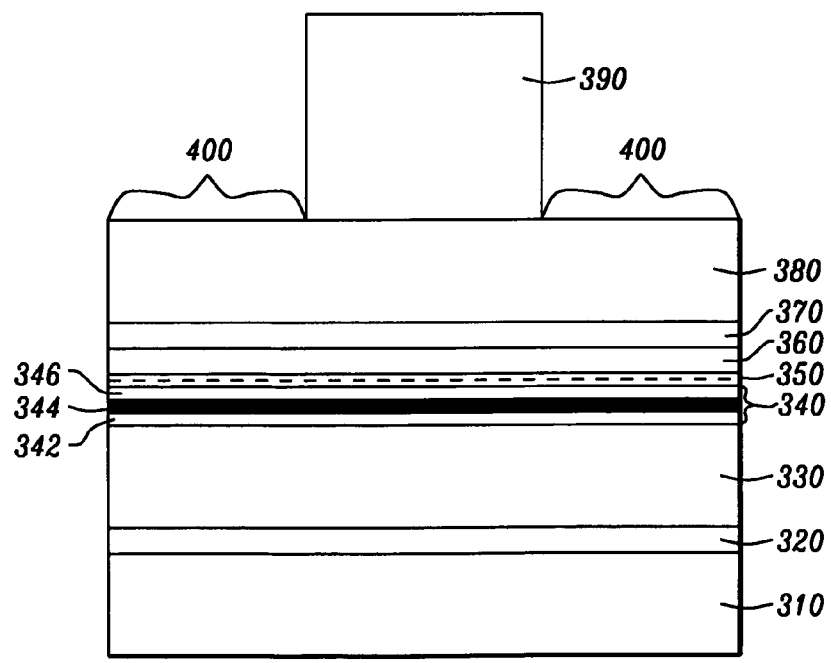
FIG. 3b schematically shows the beginning steps of the process of the present invention.

Referring now to FIG. 3b, there is shown schematically the stack of FIG. 3a with the addition of a photolithographically patterned layer of BARC (390) (a Bottom Anti-Reflection Coating to improve exposure quality) formed to a thickness of approximately 600 Angstroms on the upper surface of the Ta hard mask (380). The unprotected region (400) laterally disposed about the peripheral edges of this layer will serve to define the portion of the stack to be etched away so as to produce the desired MTJ cell shape. The periphery of the horizontal cross-sectional shape of the patterned layer can be elliptical, convex, concave, or any desired shape, and yet the method to be described below will meet the objects of the invention.

Figure 3C:
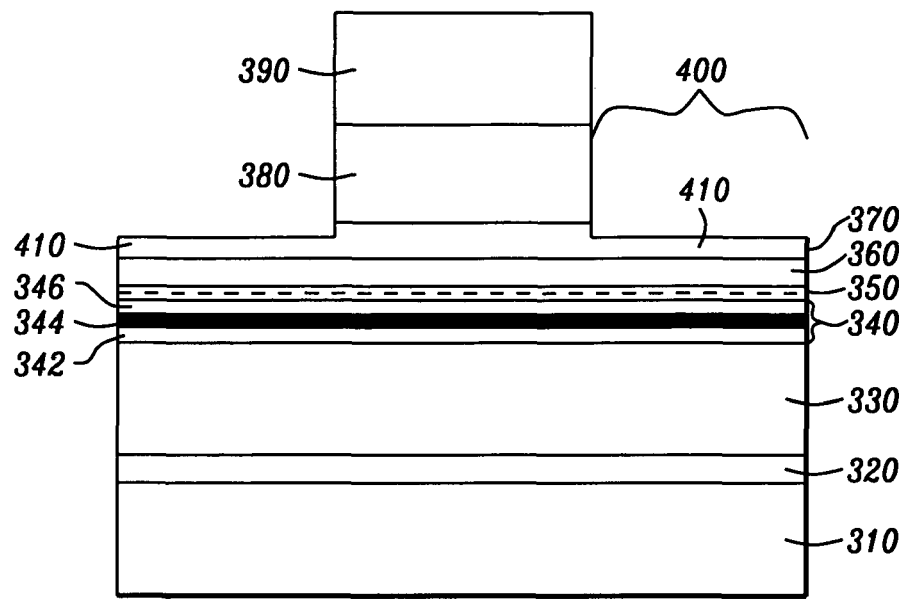
FIG. 3c shows the removal of the lateral portion of a hard mask layer.

Referring next to FIG. 3c, there is shown schematically the fabrication of FIG. 3b with the BARC (390), the Ta layer (380) and the magnetic capping layer (370) all having been partially etched away by the application of a $CF_4$ hard-mask etchant gas applied at a rate of approximately 50 sccm in the RIE chamber. The laterally disposed regions (400) of the BARC and the Ta (not being protected by the patterned photoresist) have been etched away completely, while leaving the non-magnetic capping layer partially thinned (410). The partially thinned region (410) of the non-magnetic capping layer (370) is a result of an over-etching (of between 15% and 40%) of the Ta layer (380) to ensure that the Ta layer is completely etched away laterally, given the non-uniformity of the etching process. The etching gas, while preferably $CF_4$ can be another carbon fluoride such as $C_4F_6$ or $C_4F_8$, or a carbon hydrogen fluoride such as $CHF_3$.

Figure 3D:
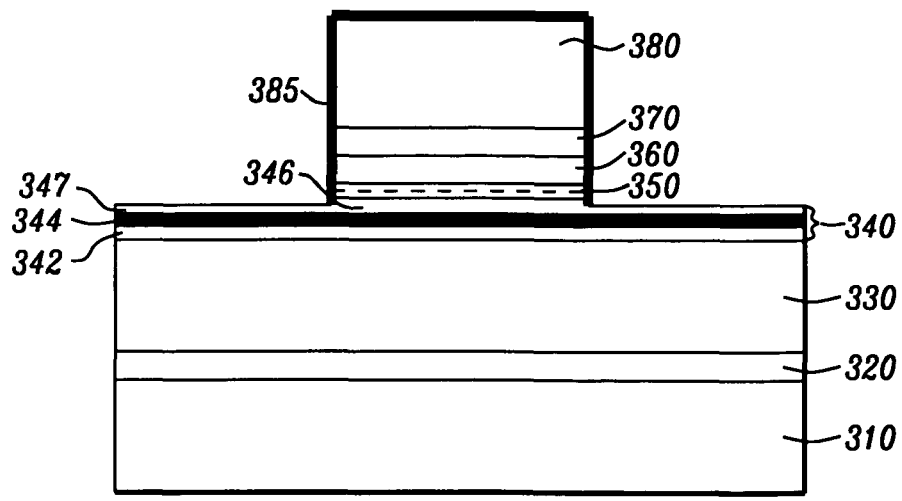
FIG. 3d schematically shows the results of applying an oxygen etching process at two successive bias power levels, creating a protective oxide coating along exposed surfaces.

Referring now to FIG. 3d, there is shown schematically the fabrication of FIG. 3c after the application of a single continuous high-power $O_2$ ashing/etching process during which the bias power is applied at two successive levels: a first level between approximately 50 W and 500 W followed by a second level at between approximately 400 W and 600 W for an additional 110-150 seconds.

During the first power level of the application, the remaining photoresist, the remaining BARC, the remaining lateral portion of the non-magnetic capping layer ((410) in FIG. 4c), along with any hard mask residue left by the $CF_4$ hard mask etch described above is removed.

With the continued application of the $O_2$ gas, now at the higher power of between approximately 400 and 600 W and for an additional time of between approximately 110 and 150 seconds, the lateral portions of the free layer (360) and the barrier layer (350) are removed, leaving only a portion (347) of the laterally disposed extent of the upper layer (346) of the pinned layer.

The entire exposed surface of the fabrication is now covered by a thin oxidized layer (385) as a result of this $O_2$ process. This surface includes the upper surface of the Ta hard mask layer (380) as well as the substantially vertical sides formed by the (generally curved) lateral edges of the Ta hard mask layer, the non-magnetic capping layer (370), the free layer (360), the barrier layer (350) and a remaining portion of the upper pinned layer (346).

In summary, the single-step process comprises the introduction of $O_2$ gas at approximately 100 sccm under a first bias power of between approximately 200 W and 500 W, followed by the continued $O_2$ application at a second, higher bias power of between approximately 400 and 600 W for a time between approximately 110 and 150 seconds.

Referring finally to FIG. 3e, there is schematically shown the fabrication of FIG. 3d after application, at a flow rate of approximately 20 sccm, of a $CH_3OH$ etch that removes the laterally disposed portions of the remaining stack layers: (346), (344), (342), (330) and (320) and, due to an over-etch condition, possibly even a small portion of the bottom electrode (310). The bottom electrode is not coextensive with the cell, but extends further laterally than the patterned cell. Although the cell is substantially formed on the horizontal surface of the bottom electrode, it is understood that the over-etch condition of the etching process can actually leave a small pedestal of the electrode directly beneath the seed layer (320) as shown in the figure. In addition, as can be seen, the portion of oxide layer (385) formed over the top surface of layer (380) has also been removed, leaving only oxide sidewalls (385) remaining to cover the lateral sides of the patterned stack. During this $CH_3OH$ etch process, the oxide sidewalls (385) act as a shield to prevent the formation of any short-circuiting path across the tunneling barrier layer (350) along the substantially vertical side outer surface of the fabrication. This final etching process employs a carbon, hydrogen, oxygen gas as an etching gas, such as $CH_3OH$ (already noted above), $C_2H_5OH$ or a mixture such as $CO/NH_3$. The over etch can be between approximately 30% and 70%.

Because there is an etching selectivity greater than 15 between the Ta hard mask (380) and the other layer materials for this etch, the Ta adequately protects the patterned structure while the laterally disposed layers that are not protected by the Ta are removed by the etch. During this entire $CH_3OH$ etch process, the oxide sidewall (385) is protecting the patterned stack from short-circuiting due to redeposit of the etching residue (which is not shown) along the stack sides. Note that to eliminate the formation of footings at the bottom edges of the MTJ cell (where it joins the electrode), the Ta hard mask must not be too thick and the Ta over etch condition should not be too long. The protection against short-circuits depends on how the $O_2$ etching process conditions are applied, in terms of power and duration as specified above. The higher power phase (400 W-600 W) of the $O_2$ etching process should etch completely through the tunneling barrier layer, which typically allows the upper pinned layer (346) to be partially etched (see (347) in FIG. 3d).

It is to be noted that short-circuits of the kind eliminated by the above described process need not have been complete so as to reduce the cell resistance to zero, they could have been only partial, so as to cause resistance variations among a large group of cells. It is precisely these random resistance variations that will produce a large standard deviation in the distribution of cell resistances among a production-lot of cells produced from a wafer. Thus, the method accomplishes the object of reducing such standard deviations.

Referring to FIG. 4, there is shown (for clarity) a schematic drawing of an actual side TEM view of two cells of the same type as shown schematically in FIG. 1. The cells in FIG. 1 have been formed using a prior art process and show the bottom footings and re-deposition of residue (10), while the cells in FIG. 4 have been formed using the present process and arrows (100) show the smooth cell side shapes and the absence of footings or re-depositions.

Referring to FIG. 5, there is shown a tabular illustration of the number of failed devices across an 8" production wafer when the devices are formed using the present method. Compared to a similar tabulation in FIG. 2, for a prior art patterned cell, the reductions of failures due to shorting is quite marked.

As is finally understood by a person skilled in the art, the preferred embodiments of the present invention are illustrative of the present invention rather than limiting of the present invention. Revisions and modifications may be made to methods, materials, structures and dimensions employed in forming providing a patterned MTJ cell protected from electrical short circuiting due to footings and re-depositions, while still forming and providing such a patterned cell in accord with the spirit and scope of the present invention as defined by the appended claims.

What is claimed is:

1. A patterned MTJ cell protected from both electrical short-circuiting resulting from re-deposition of etching residues and from the formation of footings, comprising:
    a horizontally extensive bottom electrode;
    a horizontally multi-layered MTJ cell formed on said electrode, said cell but not coextensive with said electrode, said cell having substantially vertical lateral sides and a substantially uniform horizontal cross-section of arbitrary peripheral shape extending to said bottom electrode, wherein said sides are defined by lateral edges of said MTJ cell layers; and
    said sides are divided into an upper portion and a lower portion; wherein
    an oxide layer conformally covers an upper portion of said substantially vertical sides; wherein
    said upper portion extends vertically downward from an upper surface of a topmost cell layer to a point above said bottom electrode; and
    said lower portion of said substantially vertical sides extends vertically downward to said bottom electrode and is not so covered.

2. The MTJ cell of claim 1 wherein said cell comprises:
    a seed layer;
    a magnetically pinned structure formed on said seed layer, said pinned structure further comprising;
        an antiferromagnetic layer formed on said seed layer;
        a bottom pinned ferromagnetic layer formed on said antiferromagnetic layer;
        a non-magnetic coupling layer formed on said bottom pinned layer;
        a top pinned ferromagnetic layer formed on said coupling layer;
    a dielectric tunneling barrier layer formed on said pinned structure;
    a magnetically free layer formed on said tunneling barrier layer;
    a non-magnetic capping layer formed on said free layer; and
    a hard mask layer formed on said non-magnetic capping layer.

3. The MTJ cell of claim 2 wherein said point above said lower electrode is a point along the lateral edge of said upper pinned layer.

4. The MTJ cell of claim 2 wherein said hard mask layer is a layer of Ta formed to a thickness between approximately 400 and 600 angstroms.

5. The MTJ cell of claim 2 wherein said non-magnetic capping layer is a layer of NiFeX, where X is Hf, Zr, Nb, Ru or Mg and wherein said layer formed to a thickness between approximately 25 and 80 angstroms and with a sufficient amount of element X to render said layer non-magnetic.

6. The MTJ cell of claim 2 wherein said free layer is a layer of CoFe formed to a thickness between approximately 15 and 50 Angstroms.

7. The MTJ cell of claim 2 wherein said dielectric barrier layer is a layer of AlOx or MgO formed to a thickness between approximately 7 and 20 Angstroms.

8. The MTJ cell of claim 2 wherein said upper pinned layer is a layer of CoFe formed to a thickness between approximately 10 and 30 Angstroms.

9. The MTJ cell of claim 2 wherein said non-magnetic coupling layer is a layer of Ru formed to a thickness between approximately 7 and 15 Angstroms.

10. The MTJ cell of claim 2 wherein said bottom pinned layer is a layer of CoFe formed to a thickness between approximately 10 and 30 Angstroms.

11. The MTJ cell of claim 2 wherein said antiferromagnetic is a layer of MnPt formed to a thickness between approximately 120 and 300 Angstroms.

12. A method of forming a patterned MTJ cell that is protected from both electrical short-circuiting resulting from re-deposition of etching residues and from the formation of footings, comprising:
    providing a bottom electrode;
    forming a horizontally multi-layered MTJ stack on said bottom electrode, said MTJ stack comprising:
        a seed layer;
        a multilayered pinned structure formed on said seed layer, the upper layer of said pinned structure being an upper pinned layer;
        a tunneling barrier layer formed on said pinned structure;
        a free layer formed on said tunneling barrier layer;
        a non-magnetic capping layer formed on said free layer;
        a hard mask layer formed on said non-magnetic capping layer;
    forming a photolithographically patterned BARC/photoresist layer on said hard mask layer, said BARC/photoresist layer having a horizontal cross-sectional shape, a vertical height and an arbitrarily shaped horizontal cross-section periphery; then
    using a hard mask etch applied in an over-etching condition, removing the portion of said hard mask layer laterally disposed beyond the periphery of said BARC/photoresist layer; then, immediately thereafter
    applying $O_2$ at an application rate and at a first bias power level, thereby removing remaining BARC/photoresist as well as any re-deposited residue of said hard mask layer; then
    while continuing the application of $O_2$ at said application rate, changing said bias power level to a second bias power level, thereby removing those portions of said capping layer, said free layer and said tunneling barrier layer of said MTJ stack laterally disposed peripherally to said hard mask layer and partially etching away a portion of said upper pinned layer laterally disposed peripherally to said hard mask layer; thereby,
    forming a protective oxide layer conformally covering the exposed upper surface of said MTJ stack and the exposed side surfaces of said MTJ stack; then
    applying a final etching process in an over-etching condition to remove remaining layers of said MTJ stack laterally disposed peripherally about said hard mask as well as removing the oxide layer covering said upper surface of the MTJ stack, whereby said portion of said oxide layer covering said side surfaces is not removed and protects said tunneling barrier layer from the formation of electrical short circuit paths and whereby no footings have been formed.

13. The method of claim 12 wherein said hard mask etch is a $CF_4$, etch and the over-etch is between 15-40%.

14. The method of claim 13 wherein said $CF_4$ is applied at a rate of approximately 50 sccm.

15. The method of claim 12 wherein said first bias power level is between approximately 200 W and 400 W and said second bias power level is between approximately 400 W and 600 W.

16. The method of claim 15 wherein said second power level has a time duration of between approximately 110 and 150 seconds.

17. The method of claim 12 wherein said final etch employs $CH_3OH$, $C_2H_5OH$ or the mixture $CO/NH_3$ and the over-etch condition is between approximately 30-70%.

18. The method of claim 12 wherein said hard mask layer is a layer of Ta having a thickness between approximately 400 and 600 angstroms.

19. The method of claim 12 wherein said horizontal cross-sectional shape of said BARC/photoresist layer can have a concave or convex periphery.

* * * * *